(12) United States Patent
Lee et al.

(10) Patent No.: US 11,574,935 B2
(45) Date of Patent: Feb. 7, 2023

(54) PIXEL ARRAY SUBSTRATE

(71) Applicant: Au Optronics Corporation, Hsinchu (TW)

(72) Inventors: Min-Tse Lee, Hsinchu (TW);
Sheng-Yen Cheng, Hsinchu (TW);
Yueh-Hung Chung, Hsinchu (TW);
Ya-Ling Hsu, Hsinchu (TW);
Chen-Hsien Liao, Hsinchu (TW);
Peng-Che Tai, Hsinchu (TW);
Ping-Hung Shih, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 370 days.

(21) Appl. No.: 16/997,919

(22) Filed: Aug. 19, 2020

(65) Prior Publication Data

US 2021/0057453 A1 Feb. 25, 2021

Related U.S. Application Data

(60) Provisional application No. 62/943,450, filed on Dec. 4, 2019, provisional application No. 62/901,837, filed on Sep. 18, 2019, provisional application No. 62/889,181, filed on Aug. 20, 2019.

(30) Foreign Application Priority Data

Aug. 7, 2020 (TW) .................................. 109126801

(51) Int. Cl.
*H01L 27/12* (2006.01)

(52) U.S. Cl.
CPC .................................. *H01L 27/124* (2013.01)

(58) Field of Classification Search
CPC ...................................................... H01L 27/124
See application file for complete search history.

(56) References Cited

U.S. PATENT DOCUMENTS

| 9,646,559 | B2 | 5/2017 | Min et al. |
| 2014/0043306 | A1 | 2/2014 | Min et al. |
| 2017/0084214 | A1* | 3/2017 | Ono ................ G02F 1/136286 |
| 2017/0110091 | A1* | 4/2017 | Huang .............. G02F 1/136286 |

FOREIGN PATENT DOCUMENTS

| CN | 103578443 | 2/2014 |
| CN | 104680967 | 6/2015 |

* cited by examiner

*Primary Examiner* — Peter M Albrecht
(74) *Attorney, Agent, or Firm* — JCIPRNET

(57) ABSTRACT

A pixel array substrate, including gate elements and transfer elements, is provided. The gate elements include an n-th gate element and an m-th gate element. The transfer elements include a n-th transfer element and an m-th transfer element electrically connected to the n-th gate element and the m-th gate element respectively. A peripheral portion of each of the transfer elements includes a first straight section. A peripheral portion of the n-th transfer element further includes a first lateral section. The first lateral section of the n-th transfer element and the first straight section of the n-th transfer element respectively belong to a first conductive layer and a second conductive layer. A peripheral portion of the m-th transfer element crosses over the first lateral section of the peripheral portion of the n-th transfer element.

10 Claims, 11 Drawing Sheets

PIXEL ARRAY SUBSTRATE

CROSS-REFERENCE TO RELATED APPLICATION

This application claims the priority benefits of U.S. provisional application Ser. No. 62/889,181, filed on Aug. 20, 2019, U.S. provisional application Ser. No. 62/901,837, filed on Sep. 18, 2019, U.S. provisional application Ser. No. 62/943,450, filed on Dec. 4, 2019, and Taiwan application serial no. 109126801, filed on Aug. 7, 2020. The entirety of each of the above-mentioned patent applications is hereby incorporated by reference herein and made a part of this specification.

BACKGROUND

Technical Field

The invention relates to a pixel array substrate.

Description of Related Art

Along with development of display technology, people's demand for display devices is no longer satisfied with optical characteristics such as high resolution, high contrast, and wide viewing angles. People also expect display devices to have elegant appearances. For example, people expect the display device to have a narrow border or even no border.

Generally, the display device includes a pixel array arranged in an active region, a data driving circuit arranged above or below the active region, and a gate driving circuit arranged on the left, right, or both sides of the active region. In order to reduce a width of left and right borders of the display device, both of the gate driving circuit and the data driving circuit may be arranged on a single side of a display region. When the gate driving circuit is arranged on the single side of the display region, gate lines extending in a horizontal direction may be electrically connected to the gate driving circuit through transfer elements extending in a vertical direction. However, when the transfer elements are arranged in the display region, the transfer elements are bound to be adjacent to data lines; a coupling effect between the transfer elements and the data lines may shift data signals on the data lines, thereby affecting display quality.

SUMMARY

The invention is directed to a pixel array substrate with better performance.

An embodiment of the invention provides a pixel array substrate including a substrate, a plurality of data lines, a plurality of gate elements, a plurality of pixel structures, and a plurality of transfer elements. The substrate has an active region and a peripheral region outside the active region. The data lines are disposed on the substrate, and arranged in a first direction. The gate elements are disposed on the substrate, and arranged in a second direction, wherein the first direction intersects with the second direction. The pixel structures are disposed on the active region of the substrate, and electrically connected to the data lines and the gate elements. The transfer elements are disposed on the substrate, and electrically connected to the gate elements respectively, wherein each of the transfer elements includes a main portion disposed in the active region and a peripheral portion arranged in the peripheral region, and the main portions of the transfer elements are arranged in the first direction. The gate elements are sequentially arranged in the second direction, and the gate elements include an n-th gate element and an m-th gate element, n and m are positive integers, and n and m are different. The transfer elements include an n-th transfer element and an m-th transfer element electrically connected to the n-th gate element and the m-th gate element, respectively. The peripheral portion of each of the transfer elements includes a first straight section extending in the second direction, and the first straight section has a signal input terminal. The peripheral portion of the n-th transfer element further includes a first lateral section, the first lateral section extends in the first direction, the first straight section of the n-th transfer element is electrically connected to the first lateral section of the n-th transfer element, and the first lateral section of the n-th transfer element and the first straight section of the n-th transfer element respectively belong to a first conductive layer and a second conductive layer different from each other. The peripheral portion of the m-th transfer element crosses over the first lateral section of the peripheral portion of the n-th transfer element.

In an embodiment of the invention, the first straight section of the peripheral portion of the n-th transfer element and the first straight section of the peripheral portion of the m-th transfer element are sequentially arranged in the first direction, the main portion of the n-th transfer element and the main portion of the m-th transfer element are sequentially arranged in a third direction, and the first direction and the third direction are opposite.

In an embodiment of the invention, the gate elements are sequentially arranged in the second direction, the gate elements include a k-th gate element, k is a positive integer, n, m, and k are different from each other; the transfer elements further include a k-th transfer element electrically connected to the k-th gate element; the peripheral portion of the k-th transfer element further includes a first lateral section, the first lateral section of the peripheral portion of the k-th transfer element extends in the first direction, and the first lateral section of the peripheral portion of the k-th transfer element and the first straight section of the peripheral portion of the k-th transfer element respectively belong to the first conductive layer and the second conductive layer different from each other; the peripheral portions of a transfer elements of the transfer elements cross over the first lateral section of the peripheral portion of the n-th transfer element, and the peripheral portions of b transfer elements of the transfer elements cross over the first lateral section of the peripheral portion of the k-th transfer element, a and b are positive integers, and a and b are different.

In an embodiment of the invention, the gate elements further include a p-th gate element and a q-th gate element. The n-th gate element, the m-th gate element, the p-th gate element and the q-th gate element are sequentially arranged in the second direction, p and q are positive integers, and n<m<p<q; the transfer elements further include a p-th transfer element and a q-th transfer element electrically connected to the p-th gate element and the q-th gate element, respectively, and the first straight section of the peripheral portion of the n-th transfer element, the first straight section of the peripheral portion of the m-th transfer element, the first straight section of the peripheral portion of the p-th transfer element, and the first straight section of the peripheral portion of the q-th transfer element are sequentially arranged in the first direction. The peripheral portion of the q-th transfer element further includes a first lateral section, and the first lateral section of the peripheral portion of the q-th transfer element extends in the third direction from the first straight section of the q-th transfer element, the first direction and the third direction are opposite to each other, the first straight section of the peripheral portion of the q-th transfer element is electrically connected to the first lateral section of the peripheral portion of the q-th transfer element, and the first straight section of the peripheral portion of the q-th transfer element and the first lateral section of the peripheral portion of the q-th transfer element respectively belong to the first conductive layers and the second conductive layer different from each other. The peripheral portion of the p-th transfer element crosses over the first lateral section of the peripheral portion of the q-th transfer element.

In an embodiment of the invention, the peripheral portion of the n-th transfer element further includes a second straight section and a second lateral section, the second straight section extends in the second direction, the second lateral section extends in the first direction, and the first lateral section of the n-th transfer element is electrically connected to the second straight section of the peripheral portion of the n-th transfer element, the second straight section of the peripheral portion of the n-th transfer element is electrically connected to the second lateral section of the n-th transfer element, the first lateral section and the second lateral section of the peripheral portion of the n-th transfer element belong to the first conductive layer, and the first straight section and the second straight section of the peripheral portion of the n-th transfer element belong to the second conductive layer.

In an embodiment of the invention, the gate elements further include a 1-st gate element, l is a positive integer, n, m, and l are different from each other; the transfer elements further includes a 1-st transfer element electrically connected to the 1-st gate element; and the 1-st transfer element crosses over the second lateral section of the peripheral portion of the n-th transfer element.

In an embodiment of the invention, the gate elements further include an r-th gate element, r is a positive integer, and n, m, and r are different from each other; the transfer elements further include an r-th transfer element electrically connected to the r-th gate element; the peripheral portion of the r-th transfer element further includes a first lateral section and a second straight section, the first lateral section of the peripheral portion of the r-th transfer element extends in the first direction, the first straight section of the r-th transfer element is electrically connected to the first lateral section of the r-th transfer element, the second straight section of the peripheral portion of the r-th transfer element extends in the second direction, the second straight section of the peripheral portion of the r-th transfer element is electrically connected to the first lateral section of the r-th transfer element, the first lateral section of the r-th transfer element belongs to the first conductive layer, and the first straight section and the second straight section of the r-th transfer element belong to the second conductive layer; the first straight section of the peripheral portion of the n-th transfer element and the second straight section of the peripheral portion of the r-th transfer element are substantially aligned in the second direction.

An embodiment of the invention provides a pixel array substrate including a substrate, a plurality of data lines, a plurality of gate elements, a plurality of pixel structures, a plurality of transfer elements and an insulating layer. The substrate has an active region and a peripheral region outside the active region. The data lines are disposed on the substrate, and arranged in a first direction. The gate elements are disposed on the substrate, and arranged in a second direction, wherein the first direction intersects with the second direction. The pixel structures are disposed on the active region of the substrate, and electrically connected to the data lines and the gate elements. The transfer elements are disposed on the substrate, wherein each of the transfer elements includes a main portion disposed in the active region, and a plurality of the main portions of the transfer element are arranged in the first direction. The insulating layer is disposed between the main portions of the transfer elements and the gate elements, wherein the main portions of the transfer elements are electrically connected to the gate elements through a plurality of contact windows of the insulating layer. The pixel structures are arranged into a plurality of pixel rows and a plurality of pixel columns, wherein the pixel columns are sequentially arranged in the first direction, and the pixel rows are sequentially arranged in the second direction, coordinates of the pixel structure located at the an x-th pixel column and a y-th pixel row are (x−1, y−1), and x and y are positive integers. The contact windows include a first contact window and a second contact window. The pixel structures include a first pixel structure adjacent to the first contact window. The pixel structures include a second pixel structure adjacent to the second contact window. Coordinates of the first pixel structure are $(x_1-1, y_1-1)$, wherein $x_1$ and $y_1$ satisfy a following equation: $(x_1-1)=[(a/c)\cdot(y_1-1)]+b_1$, wherein a is a ratio of a width of the active region in the first direction to a width of the active region in the second direction, c is a number of the transfer elements electrically connected to a gate element, and $|b_1|>1$. Coordinates of the second pixel structure are $(x_2-1, y_2-1)$, wherein $x_2$ and $y_2$ satisfy a following equation: $(x_2-1)=[(a/c)\cdot(y_2-1)]+b_2$, wherein a is the ratio of the width of the active region in the first direction to the width of the active region in the second direction, c is the number of the transfer elements electrically connected to a gate element, and $|b_2|>1$.

In an embodiment of the invention, $1<|b_1|<20$.

In an embodiment of the invention, $1<|b_2|<20$.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
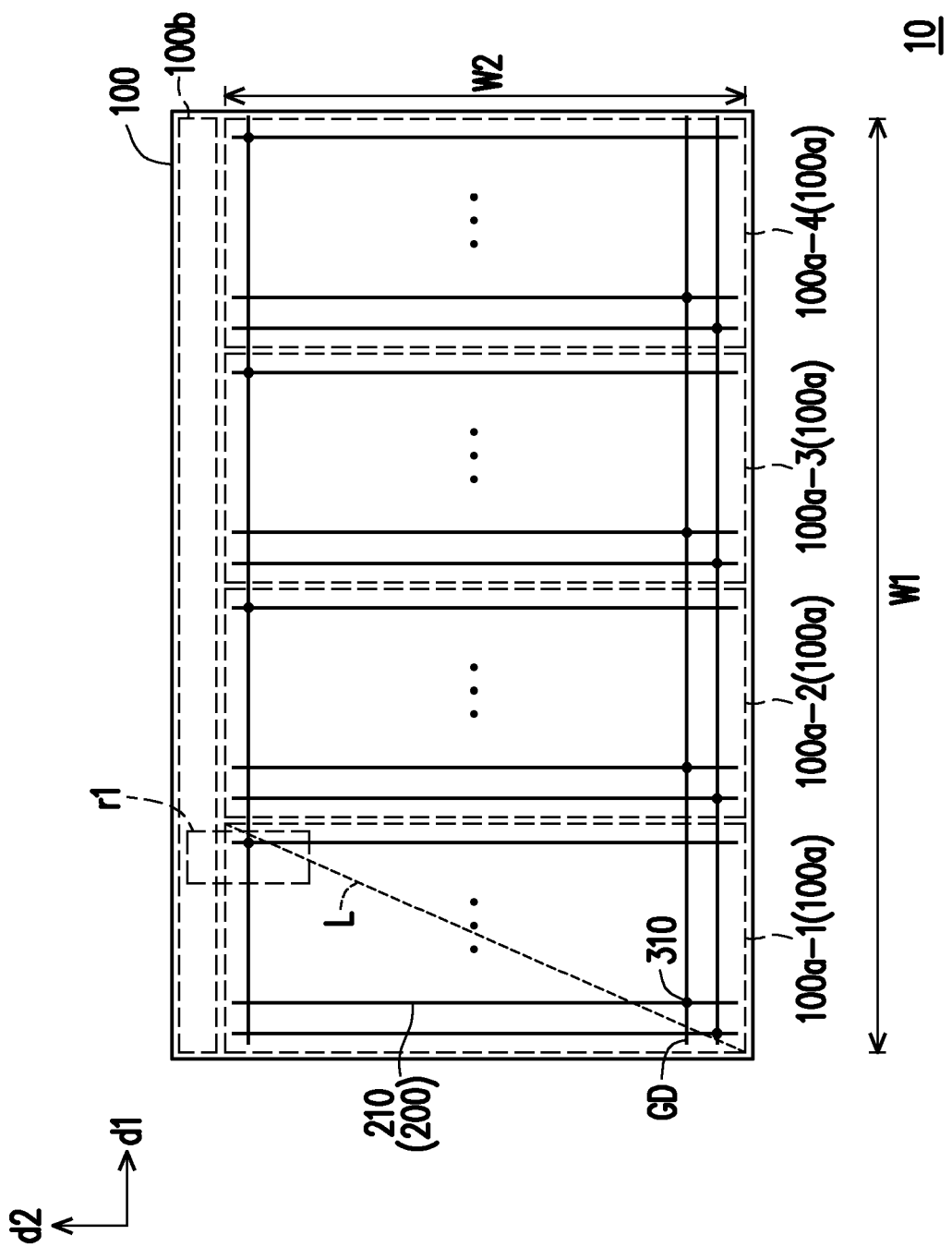
FIG. 1 is a schematic top view of a pixel array substrate 10 according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

It should be understood that when a device such as a layer, a film, a region, or a substrate is referred to as "on" or "connected" to another device, it may be directly on or connected to the other device, or other devices probably exist there between. Comparatively, when the device is referred to be "directly on" or "directly coupled" to another device, none other device exits there between. The "connection" used herein may refer to both physical and/or electrical connections. Furthermore, "electrical connection" or "coupling" may refer to that there are other devices between the two devices.

The terms "about", "approximate" or "substantial" used herein include the related value and an average within an acceptable deviation range for a specific value determined by those skilled in the art, considering a discussed measurement and a specific number of errors related to the measurement (i.e. a limitation of a measuring system). For example, "about" may represent a range within one or a plurality of standard deviations of the related value, or within ±30%, ±20%, +10%, ±5%. Moreover, an acceptable deviation range or standard deviation may be selected for the "about", "approximate" or "substantial" used in the specification based on optical properties, etching properties, or other properties without using one standard deviation for all properties.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic top view of a pixel array substrate 10 according to an embodiment of the invention.

Figure 2:
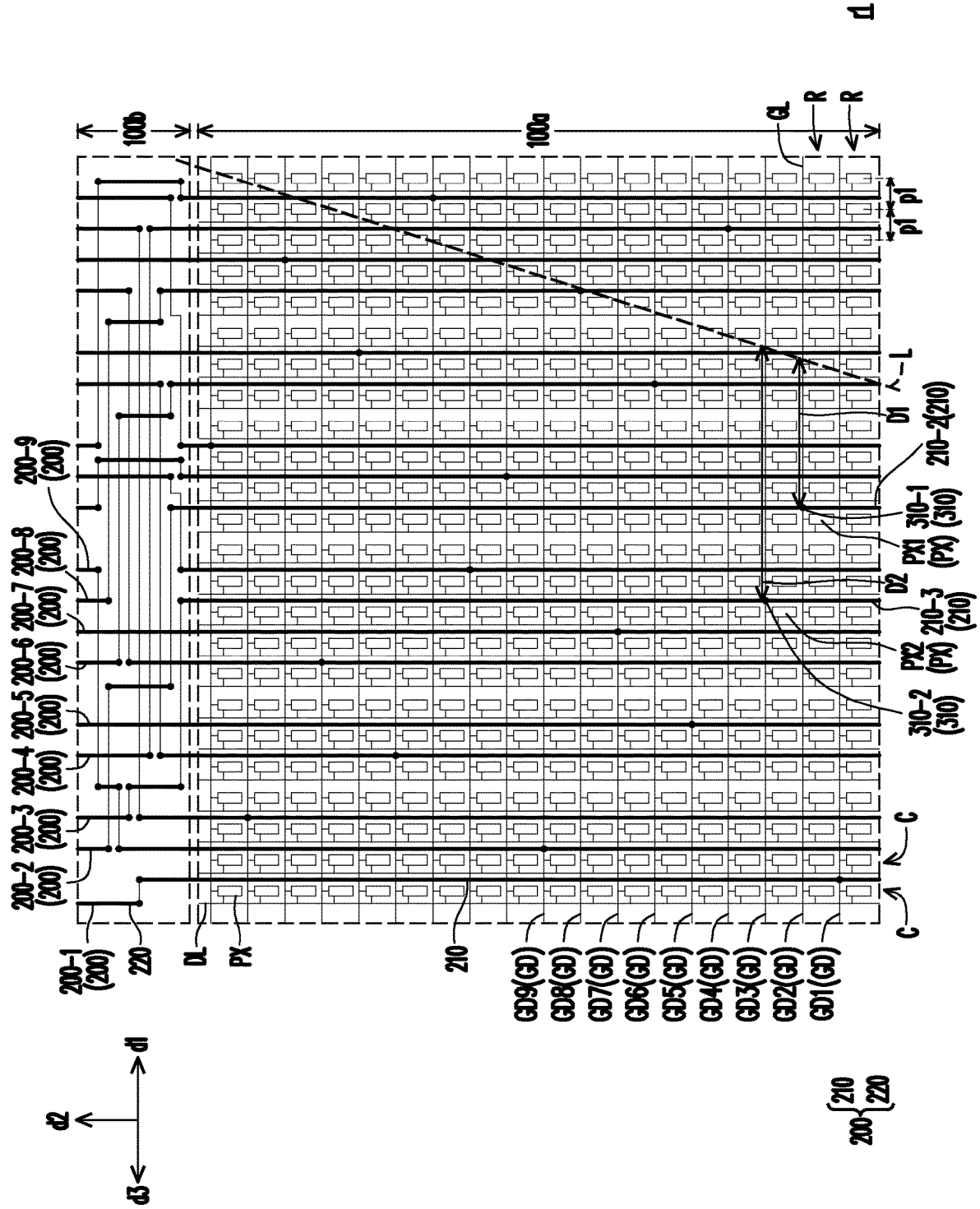
FIG. 2 is a schematic enlarged view of a part r1 of the pixel array substrate 10 according to an embodiment of the invention.

FIG. 2 is a schematic enlarged view of a part r1 of the pixel array substrate 10 according to an embodiment of the invention. FIG. 2 corresponds to the part r1 of FIG. 1.

FIG. 1 illustrates an active region 100a of the substrate 100, a peripheral region 100b of the substrate 100, a plurality of gate elements GD, and a plurality of main portions 210 of a plurality of transfer elements 200, but a plurality of data lines DL, a plurality of pixel structures PX, and a plurality of peripheral portions 220 of the transfer elements 200 in FIG. 2 are omitted.

Referring to FIG. 1 and FIG. 2, the pixel array substrate 10 includes the substrate 100. The substrate 100 has the active region 100a and the peripheral region 100b outside the active region 100a. In the embodiment, the peripheral region 100b may be a region located on a single side of the substrate 100, but the invention is not limited thereto.

For example, in the embodiment, a material of the substrate 100 may be glass. However, the invention is not limited thereto, and in other embodiments, the material of the substrate 100 may also be quartz, an organic polymer, or an opaque/reflective material (for example, wafers, ceramics, etc.), or other applicable materials.

The pixel array substrate 10 further includes a plurality of data lines DL and a plurality of gate elements GD, which are disposed on the substrate 100. Each gate element GD includes at least one gate line GL. The data lines DL are arranged in a first direction d1. The gate elements GD are arranged in a second direction d2. The first direction d1 intersects with the second direction d2. For example, in the embodiment, the first direction d1 may be perpendicular to the second direction d2, but the invention is not limited thereto.

In the embodiment, the gate elements GD and the data lines DB may respectively belong to a first conductive layer and a second conductive layer different from each other. For example, in the embodiment, the first conductive layer and the second conductive layer may be respectively a first metal layer and a second metal layer, the gate elements GD may selectively belong to the first metal layer, and the data lines DL may selectively belong to the second metal layer, but the invention is not limited thereto.

Based on consideration of conductivity, in the embodiment, the gate elements GD and the data lines DL are made of metal materials. However, the invention is not limited thereto, and in other embodiments, the gate elements GD and the data lines DL may also be made of other metal materials, for example, alloys, nitrides of metal materials, oxides of metal materials, oxynitrides of metal materials, or stacked layers of metal materials and other conductive materials.

The pixel array substrate 10 further includes a plurality of pixel structures PX, which are disposed on the active region 100a of the substrate 100, and electrically connected to the data lines DL and the gate elements GD. For example, in the embodiment, each pixel structure PX may include a thin-film transistor (not shown) and a pixel electrode (not shown), where a source and a gate of the thin-film transistor may be electrically connected to a corresponding data line DL and a corresponding gate line GL, respectively, and the pixel electrode is electrically connected to a drain of the thin-film transistor.

The pixel structures PX are arranged into a plurality of pixel rows R and a plurality of pixel columns C. The pixel columns C are sequentially arranged in the first direction d1. The pixel structures PX of each pixel column C are sequentially arranged in the second direction d2. The pixel rows R are sequentially arranged in the second direction d2. The pixel structures PX of each pixel row R are sequentially arranged in the first direction d1.

For example, in the embodiment, the pixel structures PX of the same pixel column C may be selectively electrically connected to a same data line DL, and the pixel structures PX of two adjacent pixel rows R may be electrically connected to a plurality of different gate elements GD, respectively. In brief, in the embodiment, the pixel array substrate 10 may adopt a driving mode of one data line and one gate line (1D1G). However, the invention is not limited thereto. In other embodiments, the pixel array substrate may also adopt driving modes of two data lines and one gate line (2D1G), two data lines and half gate line (2DhG), or other driving modes.

The pixel array substrate 10 further includes a plurality of transfer elements 200 disposed on the substrate 100. Each transfer element 200 includes a main portion 210 disposed in the active region 100a and a peripheral portion 220 disposed in the peripheral region 100b. The main portions 210 of the transfer elements 200 are arranged in the first direction d1. For example, in the embodiment, the data lines DL and the main portions 210 of the transfer elements 200 may belong to a same conductive layer, for example, the aforementioned second metal layer, but the invention is not limited thereto.

Figure 3:
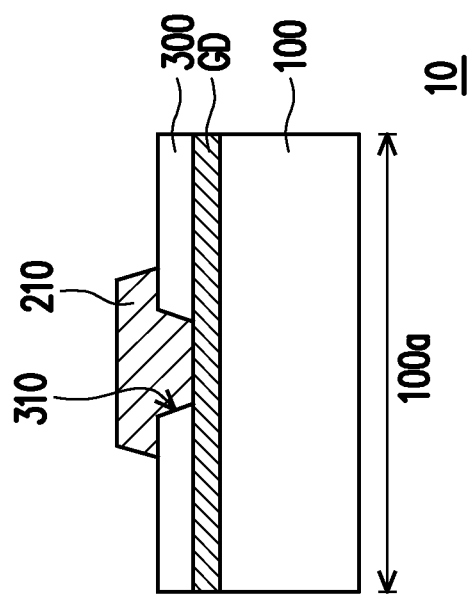
FIG. 3 is a schematic cross-sectional view of the pixel array substrate 10 according to an embodiment of the invention.

FIG. 3 is a schematic cross-sectional view of the pixel array substrate 10 according to an embodiment of the invention. FIG. 3 corresponds to a contact window 310 of FIG. 2.

Referring to FIG. 2 and FIG. 3, the transfer elements 200 are electrically connected to the gate elements GD, respectively. To be specific, in the embodiment, the pixel array substrate 10 further includes an insulating layer 300 disposed between the main portions 210 of the transfer elements 200 and the gate elements GD. The main portions 210 of the transfer elements 200 are electrically connected to the gate elements GD through a plurality of contact windows 310 of the insulating layer 300.

In the embodiment, a material of the insulating layer 300 may be an inorganic material (for example: silicon oxide, silicon nitride, silicon oxynitride, or a stacked layer of at least two of the above materials), an organic material or a combination thereof.

Referring to FIG. 1 and FIG. 2, for example, in the embodiment, the same gate element GD may be electrically connected to four transfer elements 200. All of the transfer elements 200 of the pixel array substrate 10 may be divided into four transfer element groups. The main portions 210 of the transfer elements 200 of each transfer element group are respectively electrically connected to all of the gate elements GD of the pixel array substrate 10. The four transfer element groups may be respectively disposed in a plurality of sub-active regions 100a-1, 100a-2, 100a-3, and 100a-4 of the active region 100a of the substrate 100. However, the invention is not limited thereto, and the number of the transfer elements 200 electrically connected to the same gate element GD may be determined according to actual requirements. In other embodiments, the number of the transfer elements 200 electrically connected to the same gate element GD may also be other than positive integers other than 4.

The pixel structures PX are arranged into a plurality of pixel rows R and a plurality of pixel columns C. The pixel columns C are sequentially arranged in the first direction d1, the pixel rows R are sequentially arranged in the second direction d2, and coordinates of a pixel structure PX located at an x-th pixel column C and a y-th pixel row R are (x−1, y−1), where x and y are positive integers.

For example, in the embodiment, coordinates of the pixel structure PX (not shown) located at the leftmost 1-st pixel column C of the sub-active region 100a-1 and the lowest 1-st pixel row R of the sub-active region 100a-1 are (0, 0).

Referring to FIG. 2 and FIG. 3, the main portions 210 of the transfer elements 200 are electrically connected to the gate elements GD through the contact windows 310 of the insulating layer 300. Referring to FIG. 2, the contact windows 310 include a first contact window 310-1 and a second contact window 310-2. The pixel structures PX include a first pixel structure PX1 adjacent to the first contact window 310-1. The pixel structures PX include a second pixel structure PX2 adjacent to the second contact window 310-2.

Referring to FIG. 1 and FIG. 2, coordinates of the first pixel structure PX1 are $(x_1-1, y_1-1)$, where $x_1$ and $y_1$ satisfy a following equation 1: $(x_1-1)=[(a/c)\cdot(y_1-1)]+b_1$, where [ ] is a Gaussian symbol, and the Gaussian symbol represents unconditional abandonment of the decimal point, a is a ratio of a width W1 of the active region 100a of the pixel array substrate 10 in the first direction d1 to a width W2 of the active region 100a of the pixel array substrate 10 in the second direction d2, c is a number of the transfer elements 200 electrically connected to a single gate element GD, and $|b_1|>1$.

Coordinates of the second pixel structure PX2 are $(x_2-1, y_2-1)$, where $x_2$ and $y_2$ satisfy a following equation 2: $(x_2-1)=[(a/c)\cdot(y_2-1)]+b_2$, where [ ] is the Gaussian symbol, and the Gaussian symbol represents unconditional abandonment of the decimal point, a is the ratio of the width W1 of the active region 100a of the pixel array substrate 10 in the first direction d1 to the width W2 of the active region 100a of the pixel array substrate 10 in the second direction d2, c is the number of the transfer elements 200 electrically connected to a single gate element GD, and $|b_2|>1$.

It should be noted that $|b_1|$ is not equal to $|b_2|$. Referring to FIG. 1 and FIG. 2, in brief, in the embodiment, the sub-active region 100a-1 of the active region 100a has a pseudo diagonal L, which passes through a pixel structure PX with coordinates (0, 0), (a/c) of the above equation 1 and equation 2 is a reciprocal of a slope of the pseudo diagonal L, and $|b_1|$ may reflect a distance D1 that the first pixel structure PX1 deviates from the pseudo diagonal L in the first direction d1, and $|b_2|$ may reflect a distance D2 that the second pixel structure PX2 deviates from the pseudo diagonal L in the first direction d1. |b1| being not equal to |b2| means that the distance D1 that the first pixel structure PX1 deviates from the pseudo diagonal L in the first direction d1 is not equal to the distance D2 that the second pixel structure PX2 deviates from the pseudo diagonal L in the first direction d1.

In other words, the contact windows 310 (or a plurality of connections between the transfer elements 200 and the gate elements GD) are scattered on the pseudo diagonal L and/or on both sides of the pseudo diagonal L, so that the pixel structures PX that have abnormal brightness (for example, brighter) due to the coupling effect between the transfer elements 200 and the data lines DL are also scattered on the pseudo diagonal L and/or on both sides of the pseudo diagonal L. Since the pixel structures PX with abnormal brightness (for example: brighter) are scattered on the pseudo diagonal L and/or on both sides of the pseudo diagonal L, it is not easy for human eyes to detect display image abnormity (for example: a bright line corresponding to the pseudo diagonal L) caused by the coupling effect between the transfer elements 200 and the data lines DL.

For example, in the embodiment, $1<|b_1|<20$. Namely, the pixel structures PX are arranged at a pitch p1 in the first direction d1, and the distance D1 that the first pixel structure PX1 deviates from the pseudo diagonal L in the first direction d1 is preferably greater than one pitch p1 and less than 20 pitches P1, but the invention is not limited thereto.

For example, in the embodiment, $1<|b_2|<20$. Namely, pixel structures PX are arranged at a pitch p1 in the first direction d1, and the distance D2 that the second pixel structure PX2 deviates from the pseudo diagonal L in the first direction d1 is preferably greater than one pitch p1 and less than 20 pitches P1, but the invention is not limited thereto.

Figure 4:
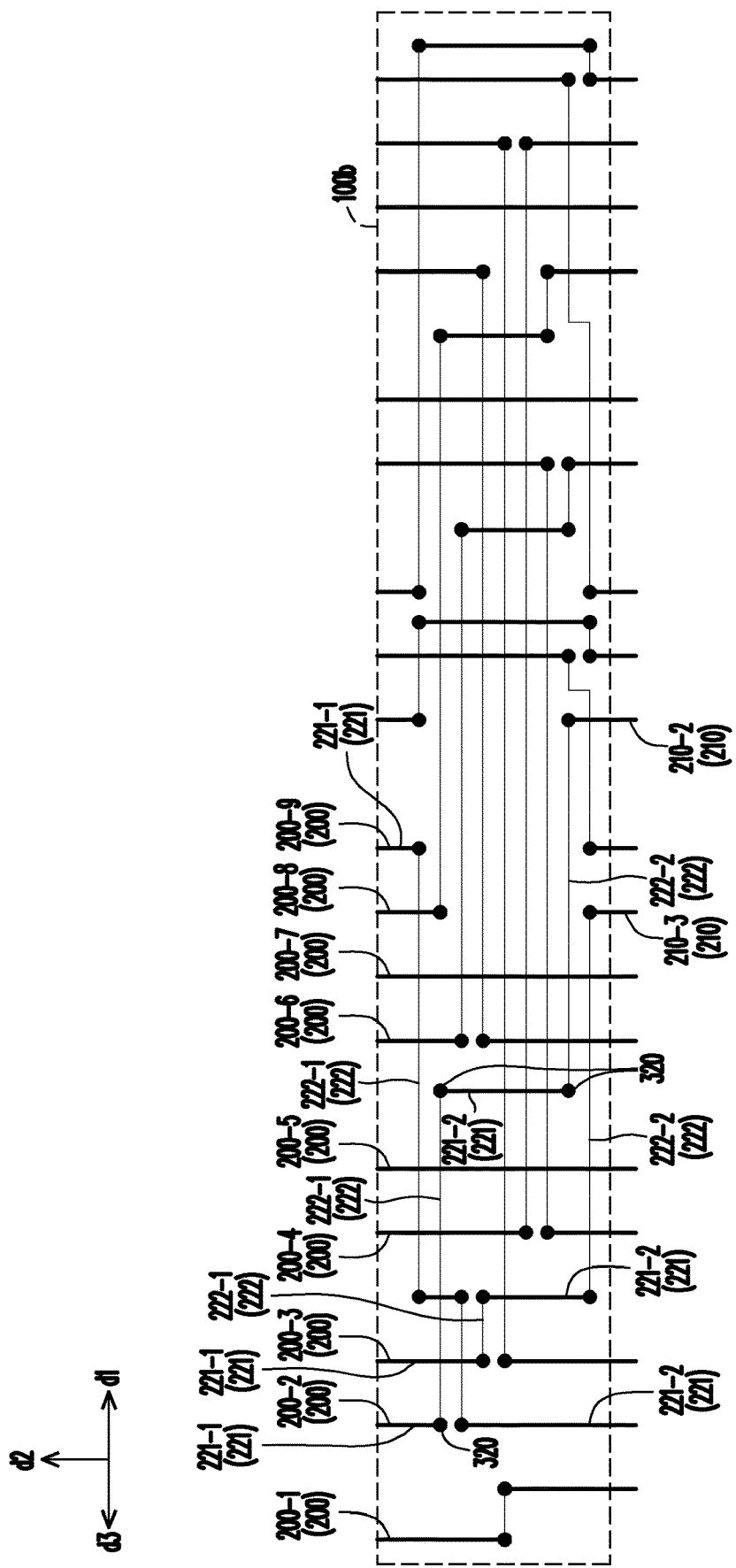
FIG. 4 is a schematic enlarged view of a plurality of peripheral portions 220 of a plurality of transfer elements 200 according to an embodiment of the invention.

FIG. 4 is a schematic enlarged view of the peripheral portions 220 of the transfer elements 200 according to an embodiment of the invention. FIG. 4 corresponds to the peripheral portions 220 of the transfer elements 200 on the peripheral region 100b of FIG. 3.

Referring to FIG. 2 and FIG. 4, the peripheral portion 220 of each transfer element 200 and the main portion 210 of the transfer element 200 are electrically connected to each other. The peripheral portion 220 of each transfer element 200 includes at least one straight section 221 extending in the second direction d2. The at least one straight section 221 of the peripheral portion 220 of each transfer element 200 includes a first straight section 221-1, where the first straight section 221-1 has a signal input terminal, and the signal input terminal is a part of the peripheral portion 220 of the transfer element 200 that is closest to a driving element (for example, a chip that is not shown).

Referring to FIG. 2, in the embodiment, the main portions 210 of the transfer elements 200 are randomly inserted in the active region 100a, and the main portions 210 of the transfer elements 200 are not arranged in accordance with an arranging order of the gate elements GD electrically connected thereto. For example, the gate elements GD includes a gate element GD1, a gate element GD2, a gate element GD3, a gate element GD4, a gate element GD5, a gate element GD6, a gate element GD7, a gate element GD8 and a gate element GD9 that are sequentially arranged in the second direction d2, and the gate element GD1, the gate element GD2, the gate element GD3, the gate element GD4, the gate element GD5, the gate element GD6, the gate element GD7, the gate element GD8 and the gate element GD9 are respectively electrically connected to a transfer element 200-1, a transfer element 200-2, a transfer element 200-3, a transfer element 200-4, a transfer element 200-5, a transfer element 200-6, a transfer element 200-7, a transfer element 200-8 and a transfer element 200-9, and the main portion 210 of the transfer element 200-1, the main portion 210 of the transfer element 200-2, the main portion 210 of the transfer element 200-3, the main portion 210 of the transfer element 200-4, the main portion 210 of the transfer element 200-5, the main portion 210 of the transfer element 200-6, the main portion 210 of the transfer element 200-7, the main portion 210 of the transfer element 200-8, and the main portion 210 of the transfer element 200-9 are not arranged in sequence in the first direction d1.

Referring to FIG. 2 and FIG. 4, however, in order to match arrangement of a plurality of output pins of a driving element (for example, a chip that is not shown), the first straight sections 221-1 of the peripheral portions 220 of the transfer elements 200 with multiple signal input terminals still needs to be sequentially arranged in the first direction d1. Therefore, at least a part of the peripheral portions 220 of the transfer elements 200 also needs to include at least one lateral section 222 that extends in the first direction d1 and belongs to a different film layer from that of the straight section 221, so as to electrically connect the main portion 210 thereof to the first straight section 221-1 that is not aligned with the main portion 210 through the at least one lateral section 222, where the at least one lateral section 222 crosses over the peripheral portions 220 of the other transfer elements 200.

For example, in the embodiment, the peripheral portion 220 of the transfer element 200-2 further includes at least one lateral section 222 belonging to a different film layer from that of the at least one straight section 221 thereof, so as to electrically connect the main portion 210 thereof to the first straight section 221-1 that is not aligned with the main portion 210 through the at least one lateral section 222, where the at least one lateral section 222 may cross over the peripheral portion 220 of the other transfer element 200-3.

Figure 5:
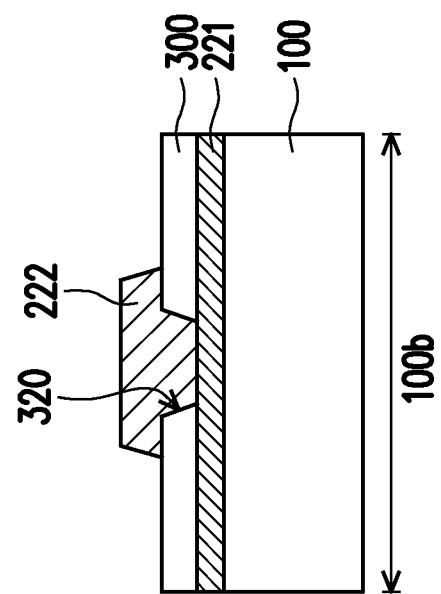
FIG. 5 is a schematic cross-sectional view of the pixel array substrate 10 according to an embodiment of the invention.

FIG. 5 is a schematic cross-sectional view of the pixel array substrate 10 according to an embodiment of the invention. FIG. 5 corresponds to a contact window 320 of FIG. 4.

Referring to FIG. 4 and FIG. 5, in the embodiment, the peripheral portions 220 of some transfer elements 200 are formed by connecting at least one straight section 221 and at least one lateral section 222, where the at least one straight section 221 extends in the second direction d2, the at least one lateral section 222 extends in the first direction d1, the at least one lateral section 222 and the at least one straight section 221 respectively belong to the first conductive layer and the second conductive layer different from each other, and the at least one straight section 221 is electrically connected to the at least one lateral section 222 through the contact window 320 of the insulating layer 300.

In FIG. 2 and FIG. 4, thin lines are used to represent the lateral sections 222 belonging to the first conductive layer, and thick lines are used to represent the straight sections 221 belonging to the second conductive layer.

Referring to FIG. 2 and FIG. 4, the gate elements GD are sequentially arranged in the second direction d2, and the gate elements GD include an n-th gate element GD and an m-th gate element GD, n and m are positive integers, and n and m are different. The transfer elements 200 include an n-th transfer element 200 and an m-th transfer element 200 electrically connected to the n-th gate element GD and the m-th gate element GD, respectively. The at least one straight section 221 of the peripheral portion 220 of each transfer element 200 includes a first straight section 221-1 extending in the second direction d2, and the first straight section 221-1 has a signal input terminal. The peripheral portion 220 of the n-th transfer element 200 may include at least one lateral section 222. The at least one lateral section 222 of the peripheral portion 220 of the n-th transfer element 200 may include a first lateral section 222-1, the first straight section 221-1 of the peripheral portion 220 of the n-th transfer element 200 is electrically connected to the first lateral section 222-1 of the peripheral portion 220 of the n-th transfer element 200, and the first lateral section 222-1 of the n-th transfer element 200 and the first straight section 221-1 of the n-th transfer element 200 respectively belong to the first conductive layer and the second conductive layer different from each other. Particularly, the peripheral portion 220 of the m-th transfer element 200 may cross over the first lateral section 222-1 of the peripheral portion 220 of the n-th transfer element 200.

For example, in the embodiment, n and m may be respectively 2 and 3, the transfer elements 200 may include a 2-nd transfer element 200-2 and a 3-rd transfer element 200-3 electrically connected to the 2-nd gate element GD2 and the 3-rd gate element GD3, respectively. The peripheral portion 220 of the 2-nd transfer element 200-2 includes a first lateral section 222-1, the first lateral section 222-1 extends in the first direction d1, the first straight section 221-1 of the 2-nd transfer element 200-2 is electrically connected to the first lateral section 222-1 of the 2-nd transfer element 200-2, and the first lateral section 222-1 of the 2-nd transfer element 200-2 and the first straight section 221-1 of the 2-nd transfer element 200-2 respectively belong to the first conductive layer and the second conductive layer different from each other. In particular, the peripheral portion 220 of the 3-rd transfer element 200-3 may cross over the first lateral section 222-1 of the peripheral portion 220 of the 2-nd transfer element 200-2.

Referring to FIG. 2 and FIG. 4, in the embodiment, the peripheral portion 220 of each transfer element 200 includes the first straight section 221-1 with the signal input terminal, and the first straight section 221-1 of the peripheral portion 220 of the n-th transfer element 200, and the first straight section 221-1 of the peripheral portion 220 of the m-th transfer element 200 are sequentially arranged in the first direction d1, but the main portion 210 of the n-th transfer element 200 and the main portion 210 of the m-th transfer element 200 are sequentially arranged in a third direction d3 opposite to the first direction d1.

For example, in the embodiment, n and m may be respectively 2 and 3. The first straight section 221-1 of the peripheral portion 220 of the 2-nd transfer element 200-2 and the first straight section 221-1 of the peripheral portion 220 of the 3-rd transfer element 200-3 are sequentially arranged in the first direction d1, but the main portion 210-2 of the 2-nd transfer element 200-2 and the main portion 210-3 of the 3-rd transfer element 200-3 are sequentially arranged in the third direction d3 opposite to the first direction d1.

Referring to FIG. 2 and FIG. 4, in the embodiment, the gate elements GD are sequentially arranged in the second direction d2, and the gate elements GD include the n-th gate element GD, the m-th gate element GD, and a k-th gate element GD, n, m and k are positive integers, and n, m, and k are different from each other. The transfer elements 200 includes the n-th transfer element 200, the m-th transfer element 200, and a k-th transfer element 200 electrically connected to the n-th gate element GD, the m-th gate element GD, and the k-th gate element GD, respectively. The peripheral portion 220 of the k-th transfer element 200 may include at least one lateral section 222. The at least one lateral section 222 of the peripheral portion 220 of the k-th transfer element 200 includes a first lateral section 222-1. The first lateral section 222-1 of the peripheral portion 220 of the k-th transfer element 200 extends in the first direction d1. The first lateral section 222-1 of the peripheral portion 220 of the k-th transfer element 200 and the first straight section 221-1 of the peripheral portion 220 of the k-th transfer element 200 respectively belong to the first conductive layer and the second conductive layer different from each other. The peripheral portions 220 of a transfer elements 200 of the plurality of transfer elements 200 cross over the first lateral section 222-1 of the peripheral portion 220 of the n-th transfer element 200, and the peripheral portions 220 of b transfer elements 200 of the plurality of transfer elements 200 cross over the first lateral section 222-1 of the peripheral portion 220 of the k-th transfer element 200, a and b are positive integers, and a and b are different.

For example, in the embodiment, n, m and k may be respectively 2, 3 and 9, the gate elements GD are sequentially arranged in the second direction d2, and the gate elements GD include the 2-nd gate element GD2, the 3-rd gate element GD3, and a 9-th gate element GD9. The transfer elements 200 include the 2-nd transfer element 200-2, the 3-rd transfer element 200-3, and a 9-th transfer element 200-9 electrically connected to the 2-nd gate element GD2, the 3-rd gate element GD3, and the 9-th gate element GD9, respectively. The peripheral portion 220 of the 9-th transfer element 200-9 further includes a first lateral section 222-1. The first lateral section 222-1 of the peripheral portion 220 of the 9-th transfer element 200-9 extends in the first direction d1. The first lateral section 222-1 of the peripheral portion 220 of the 9-th transfer element 200-9 and the first straight section 221-1 of the peripheral portion 220 of the 9-th transfer element 200-9 respectively belong to the first conductive layer and the first conductive layer different from each other. The peripheral portions 220 of four transfer elements 200 (for example: the peripheral portion 220 of the 3-rd transfer element 200-3, the peripheral portion 220 of the 9-th transfer element 200-9, the peripheral portion 220 of the 4-th transfer element 200-4, and the peripheral portion 220 of the 5-th transfer element 200-5) cross over the first lateral section 222-1 of the peripheral portion 220 of the 2-nd transfer element 200-2. The peripheral portions 220 of five transfer elements 200 (for example: the peripheral portion 220 of the 4-th transfer element 200-4, the peripheral portion 220 of the 5-th transfer element 200-5, the peripheral portion 220 of the 6-th transfer element 200-6, the peripheral portion 220 of the 7-th transfer element 200-7, and the peripheral portion 220 of the 8-th transfer element 200-8) cross over the first lateral section 222-1 of the peripheral portion 220 of the 9-th transfer element 200-9.

In brief, in the embodiment, the number of times that the first lateral section 222-1 of one transfer element 200 is crossed over by the peripheral portions 220 of the other transfer elements 200 is different from the number of times that the first lateral section 222-1 of another transfer element 200 is crossed over by the peripheral portions 220 of the other transfer elements 200.

Referring to FIG. 2 and FIG. 4, in the embodiment, the gate elements GD includes the n-th gate element GD, the m-th gate element GD, a p-th gate element GD, and a q-th gate element GD sequentially arranged in the second direction d2, n, m, p and q are positive integers, and n<m<p<q; the transfer elements 200 includes the n-th transfer element 200, the m-th transfer element 200, a p-th transfer element 200, and a q-th transfer element 200 electrically connected to the n-th gate element GD, the m-th gate element GD, the p-th gate element GD, and the q-th gate element GD, respectively. The first straight section 221-1 of the peripheral portion 220 of the n-th transfer element 200, the first straight section 221-1 of the peripheral portion 220 of the m-th transfer element 200, the first straight section 221-1 of the peripheral portion 220 of the p-th transfer element 200 and the first straight section 221-1 of the peripheral portion 220 of the q-th transfer element 200 are sequentially arranged in the first direction d1; the peripheral portion 220 of the n-th transfer element 200 includes at least one lateral section 222, the at least one lateral section 222 of the n-th transfer element 200 includes a first lateral section 222-1, the first straight section 221-1 of the n-th transfer element 200 is electrically connected to the first lateral section 222-1 of the n-th transfer element 200, the first lateral section 222-1 of the n-th transfer element 200 extends along the first direction d1 from the first straight section 221-1 of the n-th transfer element 200, and the peripheral portion 220 of the m-th transfer element 200 crosses over the first lateral section 222-1 of the peripheral portion 220 of the n-th transfer element 200; the peripheral portion 220 of the q-th transfer element 200 includes at least one lateral section 222, the at least one lateral section 222 of the q-th transfer element 200 includes a first lateral section 222-1, the first straight section 221-1 of the peripheral portion 220 of the q-th transfer element 200 is electrically connected to the first lateral section 222-1 of the peripheral portion 220 of the q-th transfer element 200, the first straight section 221-1 of the peripheral portion 220 of the q-th transfer element 200 and the first lateral section 222-1 of the peripheral portion 220 of the q-th transfer element 200 respectively belong to the first conductive layer and the second conductive layer different from each other; the peripheral portion 220 of the p-th transfer element 200 crosses over the first lateral section 222-1 of the peripheral portion 220 of the q-th transfer element 200, and the first lateral section 222-1 of the peripheral portion 220 of the q-th transfer element 200 extends in the third direction d3 from the first straight section 221-1 of the q-th transfer element 200, and the first direction d1 is opposite to the third direction d3.

For example, in the embodiment, n, m, p and q may be respectively 2, 3, 8 and 9, the gate elements GD include the 2-nd gate element GD2, the 3-rd gate element GD3, an 8-th gate element GD8, and a 9-th gate element GD9 sequentially arranged in the second direction d2. The transfer elements 200 include the 2-nd transfer element 200-2, the 3-rd transfer element 200-3, an 8-th transfer element 200-8, and a 9-th transfer element 200-9 electrically connected to the 2-nd gate element GD2, the 3-rd gate element GD3, the 8-th gate element GD8, and the 9-th gate element GD9, respectively; the first straight section 221-1 of the peripheral portion 220 of the 2-nd transfer element 200-2, the first straight section 221-1 of the peripheral portion 220 of the 3-rd transfer element 200-3, the first straight section 221-1 of the peripheral portion 220 of the 8-th transfer element 200-8, and the first straight section 221-1 of the peripheral portion 220 of the 9-th transfer element 200-9 are sequentially arranged in the first direction d1; the peripheral portion 220 of the 2-nd transfer element 200-2 includes a first lateral section 222-1, and the first straight section 221-1 of the 2-nd transfer element 200-2 is electrically connected to the first lateral section 222-1 of the 2-nd transfer element 200-2, the first straight section 221-1 of the peripheral portion 220 of the 2-nd transfer element 200-2 and the first lateral section 222-1 of the peripheral portion 220 of the 2-nd transfer element 200-2 respectively belong to the first conductive layer and the second conductive layer different from each other; the first lateral section 222-1 of the 2-nd transfer element 200-2 extends in the first direction d1 from the first straight section 221-1 of the 2-nd transfer element 200-2, and the peripheral portion 220 of the 3-rd transfer element 200-3 crosses over the first lateral section 222-1 of the peripheral portion 220 of the 2-nd transfer element 200-2; the peripheral portion 220 of the 9-th transfer element 200-9 further includes a first lateral section 222-1, and the first straight section 221-1 of the peripheral portion 220 of the 9-th transfer element 200-9 is electrically connected to the first lateral section 222-1 of the peripheral portion 220 of the 9-th transfer element 200-9, and the first straight section 221-1 of the peripheral portion 220 of the 9-th transfer element 200-9 and the first lateral section 222-1 of the peripheral portion 220 of the 9-th transfer element 200-9 respectively belong to the first conductive layer and the second conductive layer different from each other; the peripheral portion 220 of the 8-th transfer element 200-8 crosses over the first lateral section 222-1 of the peripheral portion 220 of the 9-th transfer element 200-9, and the first lateral section 222-1 of the peripheral portion 220 of the 9-th transfer element 200-9 extends in the third direction d3 from the first straight section 221-1 of the 9-th transfer element 200-9, and the first direction d1 is opposite to the third direction d3.

In brief, in the embodiment, the first lateral sections 222-1 of the peripheral portions 220 of the transfer elements 200 are crossed over by the peripheral portions 220 of the other transfer elements 200; particularly, the first lateral section 222-1 of one of the transfer elements 200 is crossed over by at least one peripheral portion 220 of at least one transfer element 200 located to the right of its first straight section 221-1, and the first lateral section 222-1 of another one of the transfer elements 200 is crossed over by at least one peripheral portion 220 of at least one transfer element 200 located to the left of its first straight section 221-1.

Referring to FIG. 2 and FIG. 4, in the embodiment, the at least one straight section 221 of the peripheral portion 220 of the n-th transfer element 200 may selectively include a second straight section 221-2 in addition to the first straight section 221-1; the at least one lateral section 222 of the peripheral portion 220 of the n-th transfer element 200 may selectively include a second lateral section 222-2 in addition to the first lateral section 222-1; the second straight section 221-2 extends in the second direction d2, the second lateral section 222-2 extends in the first direction d1, and the first lateral section 222-1 of the n-th transfer element 200 is electrically connected to the second straight section 221-2 of the peripheral portion 220 of the n-th transfer element 200, the second straight section 221-2 of the peripheral portion 220 of the n-th transfer element 200 is electrically connected to the second lateral section 222-2 of the n-th transfer element 200, the first lateral section 222-1 and the second lateral section 222-2 of the peripheral portion 220 of the n-th transfer element 200 belong to the first conductive layer, and the first straight section 221-1 and the second straight section 221-2 of the peripheral portion 220 of the n-th transfer element 200 belong to the second conductive layer.

For example, in the embodiment, n may be 2; in addition to the first straight section 221-1 and the first lateral section 222-1, the peripheral portion 220 of the 2-nd transfer element 200-2 also includes a second straight section 221-2 and a second lateral section 222-2, the second straight section 221-2 extends in the second direction d2, the second lateral section 222-2 extends in the first direction d1, the first lateral section 222-1 of the 2-nd transfer element 200-2 is electrically connected to the second straight section 221-2 of the peripheral portion 220 of the 2-nd transfer element 200-2, the second straight section 221-2 of the peripheral portion 220 of the 2-nd transfer element 200-2 is electrically connected to the second lateral section 222-2 of the 2-nd transfer element 200-2, the first lateral section 222-1 and the second lateral section 222-2 of the peripheral portion 220 of the 2-nd transfer element 200-2 belong to the first conductive layer, and the first straight section 221-1 and the second straight section 221-2 of the peripheral portion 220 of the 2-nd transfer element 200-2 belong to the second conductive layer. In other words, in the embodiment, the peripheral portion 220 of at least one transfer element 200 may selectively have two or more turning points.

Referring to FIG. 2 and FIG. 4, in the embodiment, the gate elements GD are sequentially arranged in the second direction d2, and the gate elements GD includes the n-th gate element GD, the m-th gate element GD and a 1-st gate element GD, n, m and 1 are positive integers, and n, m, and 1 are different from each other; the transfer elements 200 include the n-th transfer element 200, the m-th transfer element 200, and a 1-st transfer element 200 electrically connected to the n-th gate element GD, the m-th gate element GD, and the 1-st gate element GD, respectively; the peripheral portion 220 of the m-th transfer element 200 crosses over the first lateral section 222-1 of the peripheral portion 220 of the n-th transfer element 200, and the peripheral portion 220 of the 1-st transfer element 200 crosses over the second lateral section 222-2 of the peripheral portion 220 of the n-th transfer element 200.

For example, in the embodiment, n, m and 1 are respectively 2, 3 and 7, the peripheral portion 220 of the 3-rd transfer element 200-3 crosses over the first lateral section 222-1 of the peripheral portion 220 of the 2-nd transfer element 200-2, and the peripheral portion 220 of the 7-th transfer element 200-7 crosses over the second lateral section 222-2 of the peripheral portion 220 of the 2-nd transfer element 200-2. In brief, in the embodiment, the peripheral portion 220 of at least one transfer element 200 may selectively include a plurality of lateral sections 222, and the lateral sections 222 may be respectively crossed over by a plurality of peripheral portions 220 of a plurality of different transfer elements 200, but the invention is not limited thereto.

Referring to FIG. 2 and FIG. 4, in the embodiment, the gate elements GD are sequentially arranged in the second direction d2, and the gate elements GD includes the n-th gate element GD, the m-th gate element GD and an r-th gate element GD, n, m and r are positive integers, and n, m, and r are different from each other; the transfer elements 200 include the n-th transfer element 200, the m-th transfer element 200, and an r-th transfer element 200 electrically connected to the n-th gate element GD, the m-th gate element GD, and the r-th gate element GD, respectively; the peripheral portion 220 of the r-th transfer element 200 further includes a first lateral section 222-1 and a second straight section 221-2, the first lateral section 222-1 of the peripheral portion 220 of the r-th transfer element 200 extends in the first direction d1, the first straight section 221-1 of the r-th transfer element 200 is electrically connected to the first lateral section 222-1 of the r-th transfer element 200, the second straight section 221-2 of the peripheral portion 220 of the r-th transfer element 200 extends in the second direction d2, the second straight section 221-2 of the peripheral portion 220 of the r-th transfer element 200 is electrically connected to the first lateral section 222-1 of the r-th transfer element 200, the first lateral section 222-1 of the r-th transfer element 200 belongs to the first conductive layer, and the first straight section 221-1 and the second straight section 221-2 of the r-th transfer element 200 belong to the second conductive layer; the first straight section 221-1 of the peripheral portion 220 of the n-th transfer element 200 and the second straight section 221-2 of the peripheral portion 220 of the r-th transfer element 200 are substantially aligned in the second direction d2.

For example, n, m and r are respectively 2, 3 and 9, the peripheral portion 220 of the 3-rd transfer element 200-3 crosses over the first lateral section 222-1 of the peripheral portion 220 of the 2-nd transfer element 200-2; the peripheral portion 220 of the 9-th transfer element 200-9 further includes a first lateral section 222-1 and a second straight section 221-2, the first lateral section 222-1 of the peripheral portion 220 of the 9-th transfer element 200-9 extends in the first direction d1, the first straight section 221-1 of the 9-th transfer element 200-9 is electrically connected to the first lateral section 222-1 of the 9-th transfer element 200-9, the second straight section 221-2 of the peripheral portion 220 of the 9-th transfer element 200-9 extends in the second direction d2, and the second straight section 221-2 of the peripheral portion 220 of the 9-th transfer element 200-9 is electrically connected to the first lateral section 222-1 of the 9-th transfer element 200-9; particularly, the first straight section 221-1 of the peripheral portion 220 of the 2-nd transfer element 200-2 and the second straight section 221-2 of the peripheral portion 220 of the 9-th transfer element 200-9 are substantially aligned in the second direction d2.

In brief, in the embodiment, the first straight section 221-1 of one transfer element 200 and the second straight section 221-2 of another transfer element 200 may be substantially aligned in the second direction d2, but the invention is not limited thereto.

It should be noticed that reference numbers of the components and a part of contents of the aforementioned embodiment are also used in the following embodiment, wherein the same reference numbers denote the same or like components, and descriptions of the same technical contents are omitted. The aforementioned embodiment may be referred for descriptions of the omitted parts, and detailed descriptions thereof are not repeated in the following embodiment.

Figure 6:
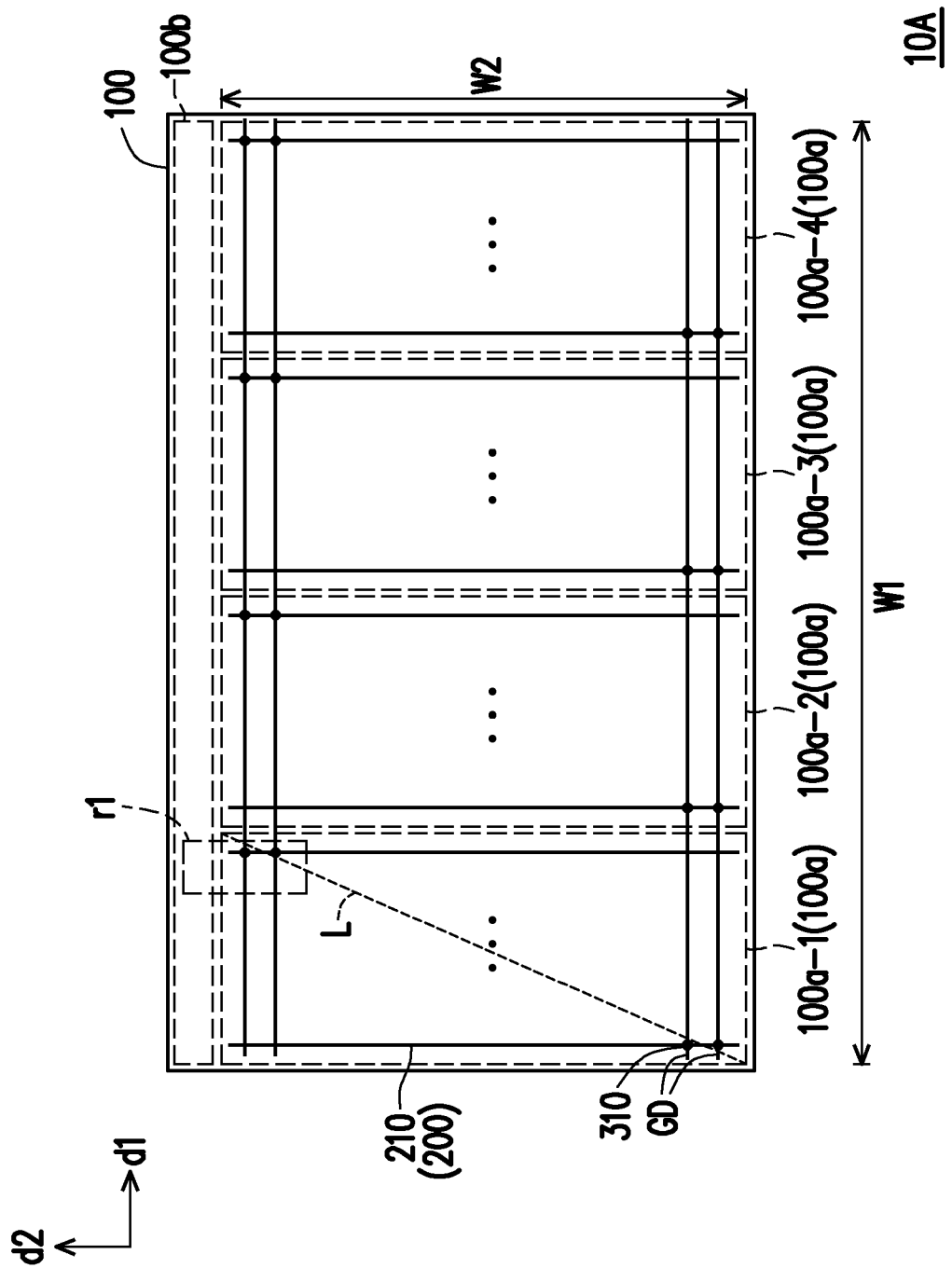
FIG. 6 is a schematic top view of a pixel array substrate 10A according to an embodiment of the invention.

FIG. 6 is a schematic top view of a pixel array substrate 10A according to an embodiment of the invention.

Figure 7:
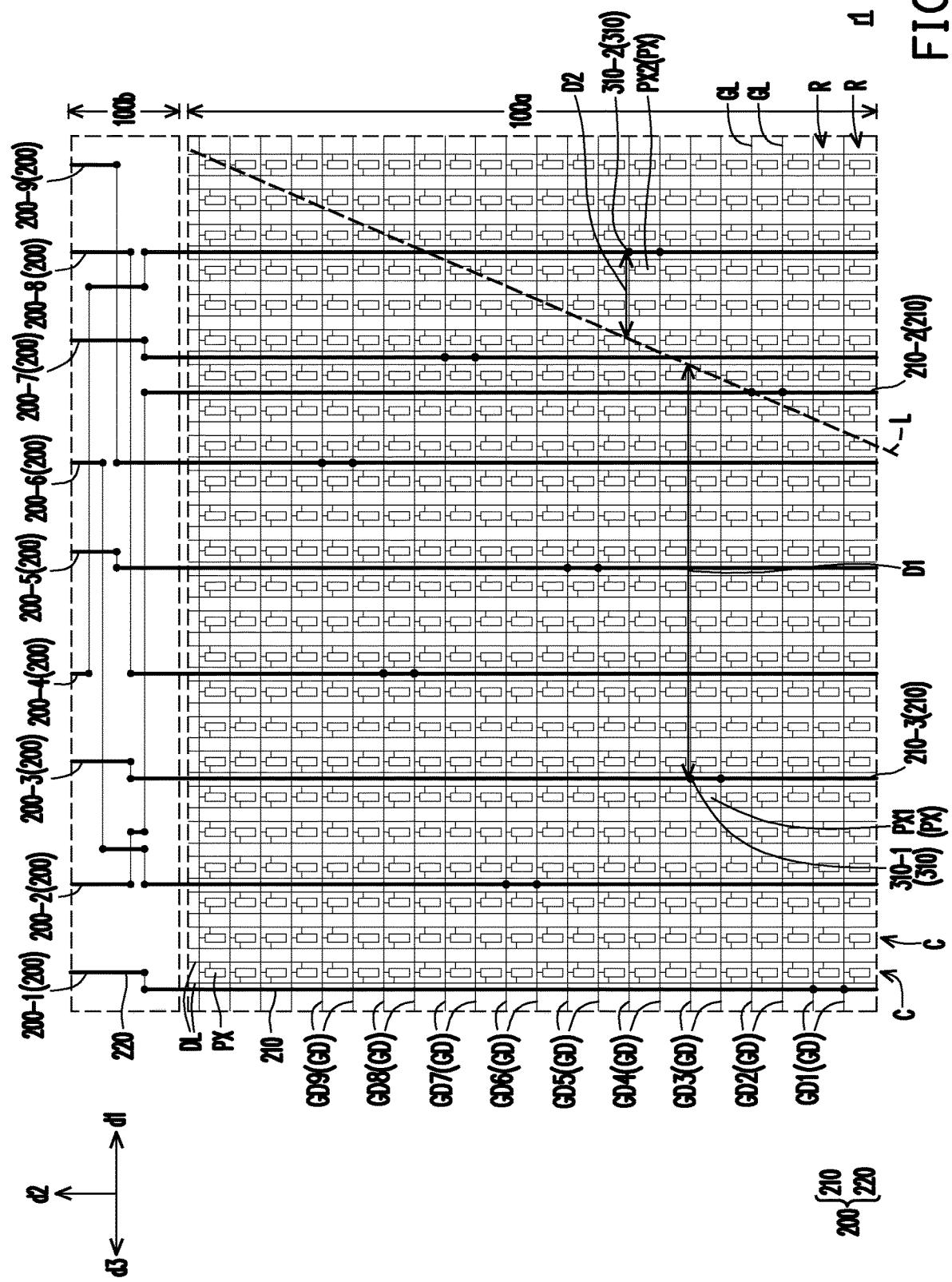
FIG. 7 is a schematic enlarged view of a part r1 of the pixel array substrate 10A according to an embodiment of the invention.

FIG. 7 is a schematic enlarged view of a part r1 of the pixel array substrate 10A according to an embodiment of the invention. FIG. 7 corresponds to the part r1 of FIG. 6.

Figure 8:
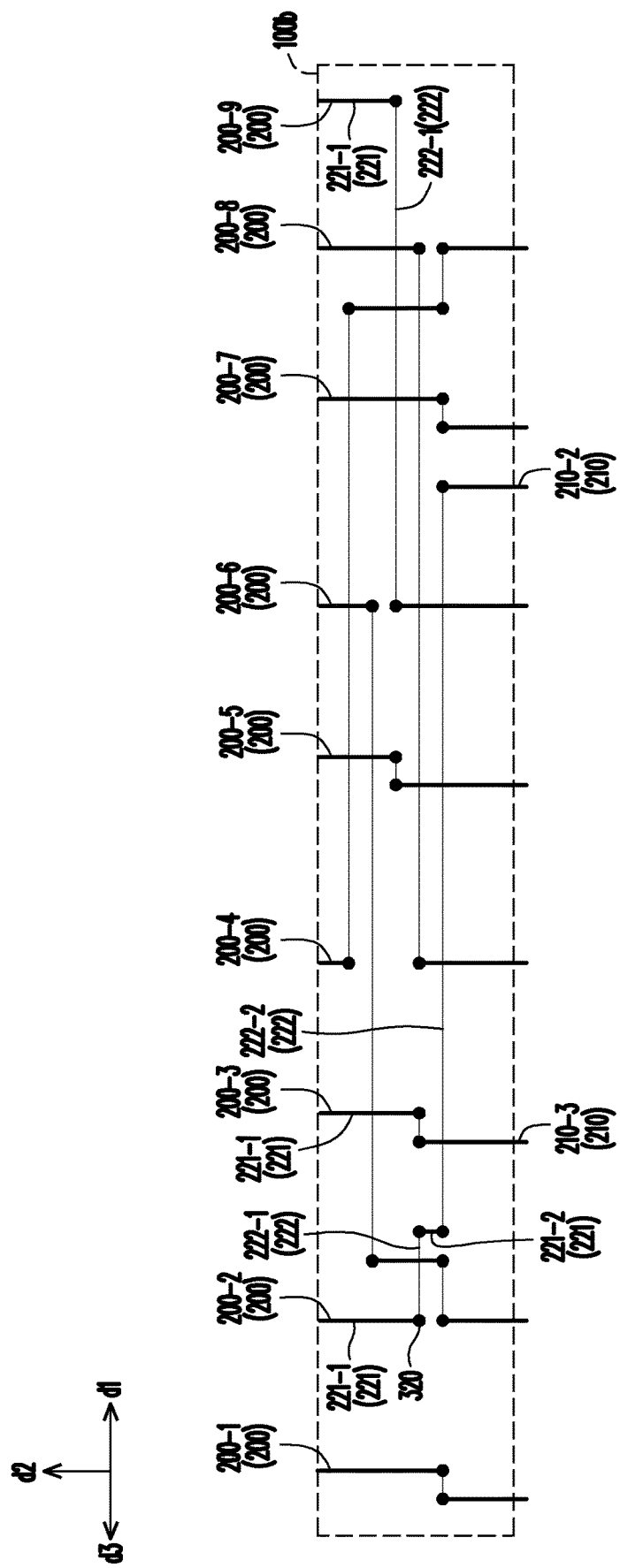
FIG. 8 is a schematic enlarged view of a plurality of peripheral portions 220 of a plurality of transfer elements 200 according to an embodiment of the invention.

FIG. 8 is a schematic enlarged view of a plurality of peripheral portions 220 of a plurality of transfer elements 200 according to an embodiment of the invention. FIG. 8 corresponds to a plurality of the peripheral portions 220 of a plurality of the transfer elements 200 on the peripheral region 100b of FIG. 7.

In FIG. 7 and FIG. 8, thin lines are used to represent the lateral sections 222 belonging to the first conductive layer, and thick lines are used to represent the straight sections 221 belonging to the second conductive layer.

Referring to FIG. 6, FIG. 7 and FIG. 8, the pixel array substrate 10A of the embodiment is similar to the aforementioned pixel array substrate 10, and main differences there between are that in the embodiment, the pixel structures PX of the same pixel column C may be selectively electrically connected to a plurality of different data lines DL, each gate element GD may include two adjacent gate lines GL, and the pixel structures PX of two adjacent pixel rows R may be electrically connected to the two gate lines GL of the same gate element GD, respectively. In brief, in the embodiment, the pixel array substrate 10A may adopt the driving mode of two data lines and half gate line (2DhG).

Referring to FIG. 6, FIG. 7 and FIG. 8, the cross-over relationship of the plurality of peripheral portions 220 of the pixel array substrate 10A of the embodiment is slightly different from the cross-over relationship of the plurality of peripheral portions 220 of the aforementioned pixel array substrate 10, which may be learned by those with general knowledge in the art by referring to FIG. 2 and FIG. 7 (and/or FIG. 4 and FIG. 8), and details thereof are not repeated.

Figure 9:
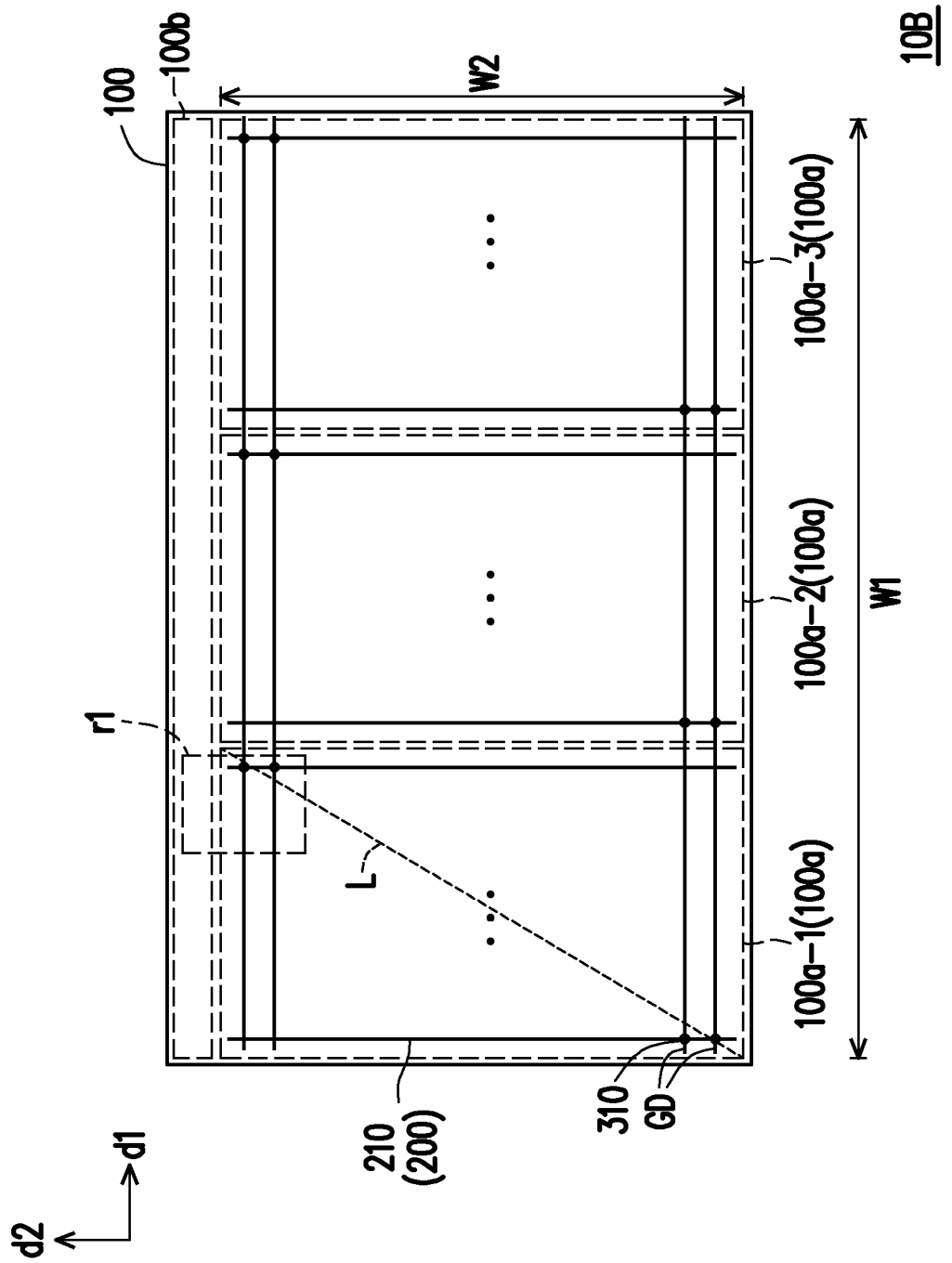
FIG. 9 is a schematic top view of a pixel array substrate 10B according to an embodiment of the invention.

FIG. 9 is a schematic top view of a pixel array substrate 10B according to an embodiment of the invention.

Figure 10:
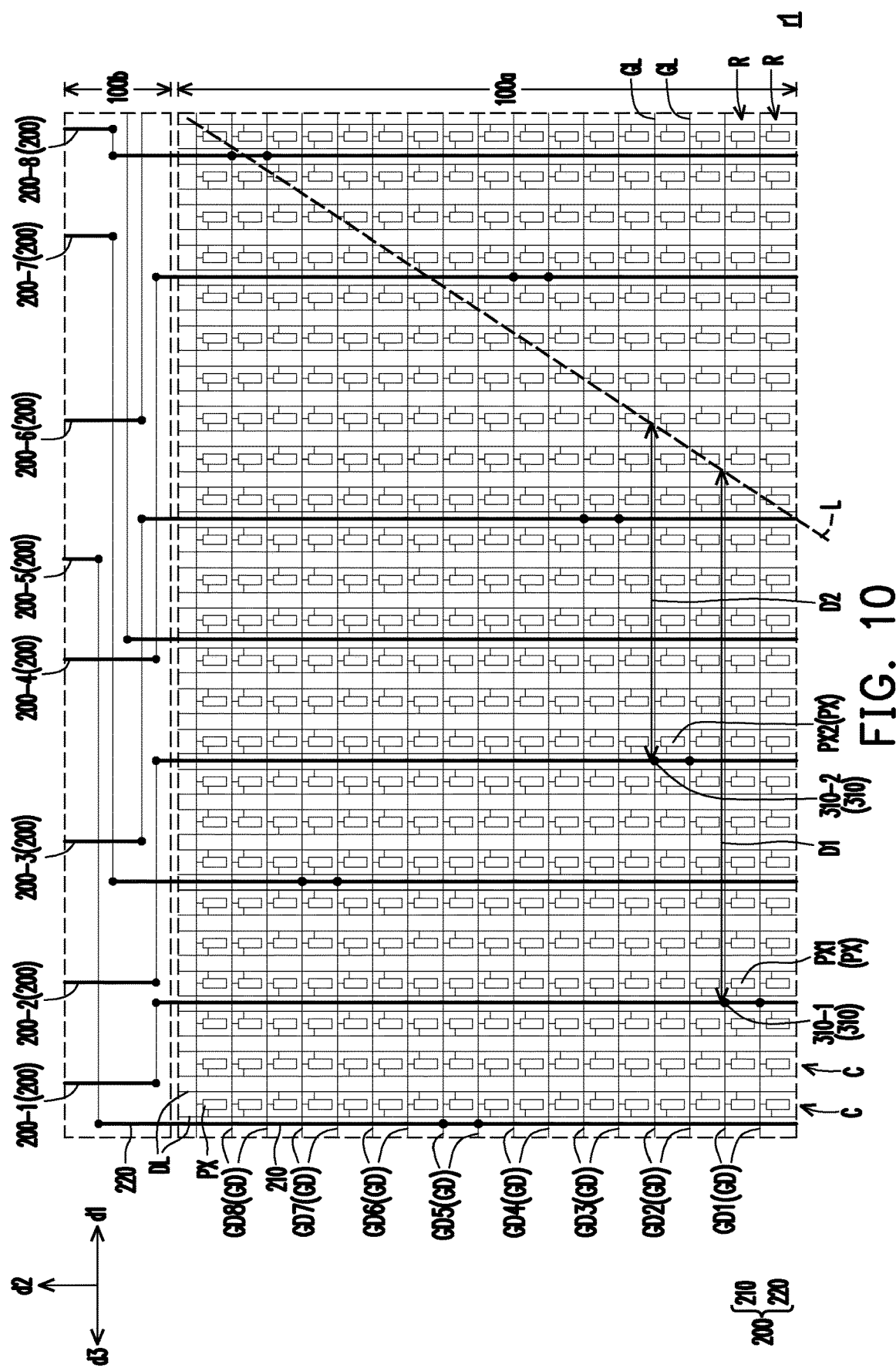
FIG. 10 is a schematic enlarged view of a part r1 of the pixel array substrate 10B according to an embodiment of the invention.

FIG. 10 is a schematic enlarged view of a part r1 of the pixel array substrate 10B according to an embodiment of the invention. FIG. 10 corresponds to the part r1 of FIG. 9.

Figure 11:
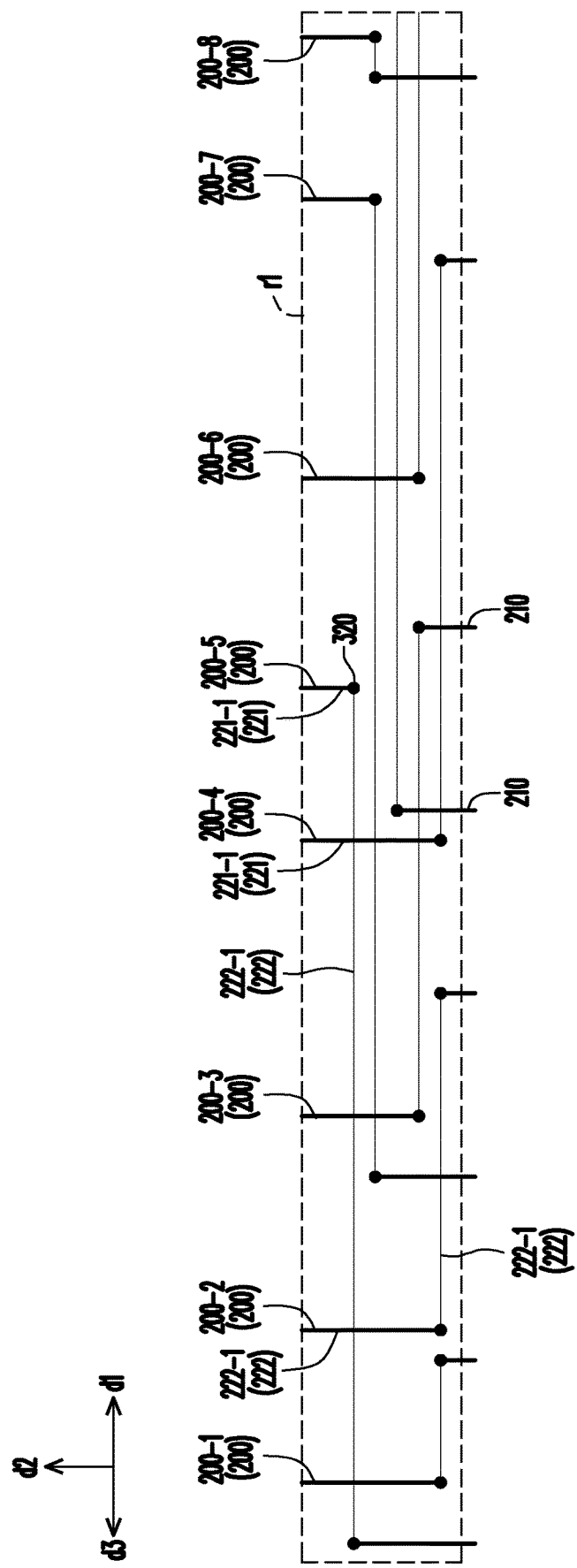
FIG. 11 is a schematic enlarged view of a plurality of peripheral portions 220 of a plurality of transfer elements 200 according to an embodiment of the invention.

FIG. 11 is a schematic enlarged view of a plurality of peripheral portions 220 of a plurality of transfer elements 200 according to an embodiment of the invention. FIG. 11 corresponds to a plurality of the peripheral portions 220 of a plurality of the transfer elements 200 on the peripheral region 100b of FIG. 10.

In FIG. 10 and FIG. 11, thin lines are used to represent the lateral sections 222 belonging to the first conductive layer, and thick lines are used to represent the straight sections 221 belonging to the second conductive layer.

Referring to FIG. 9, FIG. 10 and FIG. 11, the pixel array substrate 10B of the embodiment is similar to the aforementioned pixel array substrate 10A, and a main difference there between is that in the embodiment of FIG. 6, FIG. 7 and FIG. 8, the number of the transfer elements 200 electrically connected to the same gate element GD is 4; but in the embodiment of FIG. 9, FIG. 10 and FIG. 11, the number of the transfer elements 200 electrically connected to the same gate element GD is 3.

Referring to FIG. 9, FIG. 10 and FIG. 11, the cross-over relationship of the plurality of peripheral portions 220 of the pixel array substrate 10B of the embodiment is slightly different from the cross-over relationship of the plurality of peripheral portions 220 of the aforementioned pixel array substrate 10A, which may be learned by those with general knowledge in the art by referring to FIG. 7 and FIG. 10 (and/or FIG. 8 and FIG. 11), and details thereof are not repeated.

What is claimed is:

1. A pixel array substrate, comprising:
a substrate, having an active region and a peripheral region outside the active region;
a plurality of data lines, disposed on the substrate and arranged in a first direction;
a plurality of gate elements, disposed on the substrate and arranged in a second direction, wherein the first direction intersects with the second direction;
a plurality of pixel structures, disposed on the active region of the substrate and electrically connected to the data lines and the gate elements; and
a plurality of transfer elements, disposed on the substrate and electrically connected to the gate elements respectively, wherein each of the transfer elements comprises a main portion disposed in the active region and a peripheral portion disposed in the peripheral region, and a plurality of main portions of the transfer elements are arranged in the first direction;
the gate elements are sequentially arranged in the second direction, and the gate elements comprise an n-th gate element and an m-th gate element, n and m are positive integers, and n and m are different;
the transfer elements comprise an n-th transfer element and an m-th transfer element electrically connected to the n-th gate element and the m-th gate element respectively,
the peripheral portion of each of the transfer elements comprises a first straight section extending in the second direction, and the first straight section has a signal input terminal;
the peripheral portion of the n-th transfer element further comprises a first lateral section, the first lateral section extends in the first direction, the first straight section of the n-th transfer element is electrically connected to the first lateral section of the n-th transfer element, and the first lateral section of the n-th transfer element and the first straight section of the n-th transfer element respectively belong to a first conductive layer and a second conductive layer different from each other; and
the peripheral portion of the m-th transfer element crosses over the first lateral section of the peripheral portion of the n-th transfer element.

2. The pixel array substrate as claimed in claim 1, wherein the first straight section of the peripheral portion of the n-th transfer element and the first straight section of the peripheral portion of the m-th transfer element are sequentially arranged in the first direction, the main portion of the n-th transfer element and the main portion of the m-th transfer element are sequentially arranged in a third direction, and the first direction and the third direction are opposite to each other.

3. The pixel array substrate as claimed in claim 1, wherein the gate elements are sequentially arranged in the second direction, the gate elements comprise a k-th gate element, k is a positive integer, and n, m, and k are different from each other; the transfer elements further comprise a k-th transfer element electrically connected to the k-th gate element; the peripheral portion of the k-th transfer element further comprises a first lateral section, the first lateral section of the peripheral portion of the k-th transfer element extends in the first direction, and the first lateral section of the peripheral portion of the k-th transfer element and the first straight section of the peripheral portion of the k-th transfer element respectively belong to the first conductive layer and the second conductive layer different from each other; the peripheral portions of a transfer elements of the transfer elements cross over the first lateral section of the peripheral portion of the n-th transfer element, the peripheral portions of b transfer elements of the transfer elements cross over the first lateral section of the peripheral portion of the k-th transfer element, a and b are positive integers, and a and b are different.

4. The pixel array substrate as claimed in claim 1, wherein the gate elements further comprise a p-th gate element and a q-th gate element, the n-th gate element, the m-th gate element, the p-th gate element, and the q-th gate element are sequentially arranged in the second direction, p and q are positive integers, and n<m<p<q;
the transfer elements further comprise a p-th transfer element and a q-th transfer element electrically connected to the p-th gate element and the q-th gate element respectively, and the first straight section of the peripheral portion of the n-th transfer element, the first straight section of the peripheral portion of the m-th transfer element, the first straight section of the peripheral portion of the p-th transfer element, and the first straight section of the peripheral portion of the q-th transfer element are sequentially arranged in the first direction;
the peripheral portion of the q-th transfer element further comprises a first lateral section, the first lateral section of the peripheral portion of the q-th transfer element extends along a third direction from the first straight section of the q-th transfer element, the first direction and the third direction are opposite to each other, the first straight section of the peripheral portion of the q-th transfer element is electrically connected to the first lateral section of the peripheral portion of the q-th transfer element, and the first straight section of the peripheral portion of the q-th transfer element and the first lateral section of the peripheral portion of the q-th transfer element respectively belong to the first conductive layer and the second conductive layer different from each other; and
the peripheral portion of the p-th transfer element crosses over the first lateral section of the peripheral portion of the q-th transfer element.

5. The pixel array substrate as claimed in claim 1, wherein the peripheral portion of the n-th transfer element further comprises a second straight section and a second lateral section, the second straight section extends in the second direction, the second lateral section extends in the first direction, the first lateral section of the n-th transfer element is electrically connected to the second straight section of the peripheral portion of the n-th transfer element, the second straight section of the peripheral portion of the n-th transfer element is electrically connected to the second lateral section of the n-th transfer element, the first lateral section and the second lateral section of the peripheral portion of the n-th transfer element belong to the first conductive layer, and the first straight section and the second straight section of the peripheral portion of the n-th transfer element belong to the second conductive layer.

6. The pixel array substrate as claimed in claim 5, wherein the gate elements further comprise a 1-st gate element, l is a positive integer, and n, m, and l are different from each other; the transfer elements further comprises a 1-st transfer element electrically connected to the 1-st gate element; and the 1-st transfer element crosses over the second lateral section of the peripheral portion of the n-th transfer element.

7. The pixel array substrate as claimed in claim 1, wherein the gate elements further comprise an r-th gate element, r is a positive integer, and n, m, and r are different from each other; the transfer elements further comprise an r-th transfer element electrically connected to the r-th gate element; the peripheral portion of the r-th transfer element further comprises a first lateral section and a second straight section, the first lateral section of the peripheral portion of the r-th transfer element extends in the first direction, the first straight section of the r-th transfer element is electrically connected to the first lateral section of the r-th transfer element, the second straight section of the peripheral portion of the r-th transfer element extends in the second direction, the second straight section of the peripheral portion of the r-th transfer element is electrically connected to the first lateral section of the r-th transfer element, the first lateral section of the r-th transfer element belongs to the first conductive layer, and the first straight section and the second straight section of the r-th transfer element belong to the second conductive layer; the first straight section of the peripheral portion of the n-th transfer element and the second straight section of the peripheral portion of the r-th transfer element are substantially aligned in the second direction.

8. A pixel array substrate, comprising:
a substrate, having an active region and a peripheral region outside the active region;
a plurality of data lines, disposed on the substrate and arranged in a first direction;
a plurality of gate elements, disposed on the substrate and arranged in a second direction, wherein the first direction intersects with the second direction;
a plurality of pixel structures, disposed on the active region of the substrate and electrically connected to the data lines and the gate elements;
a plurality of transfer elements, disposed on the substrate, wherein each of the transfer elements comprises a main portion disposed in the active region, and a plurality of main portions of the transfer elements are arranged in the first direction; and
an insulating layer, disposed between the main portions of the transfer elements and the gate elements, wherein the main portions of the transfer elements are electrically connected to the gate elements through a plurality of contact windows of the insulating layer;
the pixel structures are arranged into a plurality of pixel rows and a plurality of pixel columns, wherein the pixel columns are sequentially arranged in the first direction, the pixel rows are sequentially arranged in the second direction, coordinates of a pixel structure located at an x-th pixel column and a y-th pixel row are (x−1, y−1), and x and y are positive integers;
the contact windows comprise a first contact window and a second contact window;
the pixel structures comprise a first pixel structure adjacent to the first contact window;
the pixel structures comprise a second pixel structure adjacent to the second contact window;
coordinates of the first pixel structure are $(x_1-1, y_1-1)$, wherein $x_1$ and $y_1$ satisfy a following equation: $(x_1-1)=[(a/c)\cdot(y_1-1)]+b_1$, where a is a ratio of a width of the active region in the first direction to a width of the active region in the second direction, c is a number of the transfer elements electrically connected to a gate element, and $|b_1|>1$;
coordinates of the second pixel structure are $(x_2-1, y_2-1)$, wherein $x_2$ and $y_2$ satisfy a following equation: $(x_2-1)=[(a/c)\cdot(y_2-1)]+b_2$, where a is the ratio of the width of the active region in the first direction to the width of the active region in the second direction, c is the number of the transfer elements electrically connected to a gate element, and $|b_2|>1$; and
$|b_1|$ is not equal to $|b_2|$.

9. The pixel array substrate as claimed in claim 8, wherein $1<|b_1|<20$.

10. The pixel array substrate as claimed in claim 9, wherein $1<|b_1|<20$.

* * * * *